(12) United States Patent
Amir

(10) Patent No.: US 9,885,961 B1
(45) Date of Patent: Feb. 6, 2018

(54) PARTLY DISAPPEARING TARGETS

(71) Applicant: KLA-Tencor Corporation, Milpitas, CA (US)

(72) Inventor: Nuriel Amir, Yokne'am Ilit (IL)

(73) Assignee: KLA-Tencor Corporation, Milpitas, CA (US)

( * ) Notice: Subject to any disclaimer, the term of this patent is extended or adjusted under 35 U.S.C. 154(b) by 573 days.

(21) Appl. No.: 14/289,143

(22) Filed: May 28, 2014

Related U.S. Application Data

(60) Provisional application No. 61/828,595, filed on May 29, 2013.

(51) Int. Cl.
*G03F 7/20* (2006.01)
*H01L 23/544* (2006.01)
*G01B 11/14* (2006.01)

(52) U.S. Cl.
CPC .......... *G03F 7/70633* (2013.01); *G01B 11/14* (2013.01); *H01L 23/544* (2013.01)

(58) Field of Classification Search
CPC .... G03F 7/70633; G01B 11/14; H01L 23/544
USPC ................ 356/399–401; 382/151; 257/797; 438/401; 430/5, 22, 30; 355/53, 55, 77; 250/548
See application file for complete search history.

(56) References Cited

U.S. PATENT DOCUMENTS

| | | | | |
|---|---|---|---|---|
| 7,061,615 B1* | 6/2006 | Lowe-Webb | ...... | G02B 27/4255 257/797 |
| 2003/0098977 A1* | 5/2003 | Kim | ........... | G03F 7/705 356/401 |
| 2005/0118514 A1* | 6/2005 | Tsai | ........... | G03F 7/70633 430/5 |
| 2009/0001615 A1* | 1/2009 | Li | ........... | H01L 22/34 257/797 |
| 2009/0027691 A1* | 1/2009 | Van Der Schaar | . | G03F 7/70433 356/612 |
| 2009/0130570 A1* | 5/2009 | Zhang | ........... | G03F 7/70466 430/5 |
| 2011/0003256 A1 | 1/2011 | Van Der Heijden et al. | | |
| 2012/0033215 A1 | 2/2012 | Kandel et al. | | |
| 2012/0049186 A1* | 3/2012 | Li | ........... | G03F 9/7084 257/48 |
| 2012/0206729 A1* | 8/2012 | Seligson | ........... | G03F 7/70633 356/445 |

* cited by examiner

*Primary Examiner* — Gordon J Stock, Jr.
(74) *Attorney, Agent, or Firm* — Suiter Swantz pc llo

(57) ABSTRACT

The present disclosure is directed to overlay metrology with targets including "disappearing" or sacrificial layers that leave no optical trace impacting OVL measurement when processed. In an embodiment, an overlay metrology target may include at least one overlay target structure inducing an optical characteristic and at least one secondary overlay target structure inducing a temporary optical characteristic. The at least one secondary overlay target structure being removable by a lithographic process and/or by etch or clean process, where removal of the at least one secondary overlay target structure removes the temporary optical characteristic. That is, the secondary target structure or "layer" leaves no optical trace impacting OVL measurement when removed, thereby allowing another target structure (e.g., a tertiary target structure or layer) to be printed in a region previously occupied by at least a portion of the secondary target structure.

16 Claims, 10 Drawing Sheets

PARTLY DISAPPEARING TARGETS

PRIORITY

The present application claims priority under 35 U.S.C. § 119(e) to U.S. Provisional Patent Application Ser. No. 61/828,595, titled PARTLY DISAPPEARING TARGETS FOR IMPLANT, By Nuriel Amir, filed May 29, 2013. The above-referenced provisional patent application is hereby incorporated by reference in its entirety.

TECHNICAL FIELD

The present disclosure generally relates to the field of metrology targets and, more particularly, to overlay metrology targets.

BACKGROUND

Semiconductor devices are often manufactured by producing a plurality of layers disposed upon a substrate, such as a silicon wafer. The alignment between the various process layers is typically controlled to ensure proper functionality and performance of a resulting device. Misalignment between device features or structures formed within two or more successive layers is often referred to as overlay error. The ability to detect and correct overlay error between patterned layers on a wafer is critical to manufacture of integrated circuits and other semiconductor devices.

Overlay metrology is a known technique for determining misalignments or overlay error between patterned device layers, typically by analyzing an overlay "target" or "mark" disposed proximate to one or more device layers of interest. For example, overlay measurements may be performed via test patterns (i.e. one or more overlay target structures) printed together with various patterned device layers on a wafer. An overlay metrology system may include an imaging tool configured to collect image frames that are analyzed by a processing unit to determine a relative displacement or misalignment of the pattern elements making up device and target layers.

Typically, regions on a substrate are dedicated and used once for an overlay target. Sometimes an area can be used multiple times by double patterning (i.e. where one layer erases the other) or by inserting a metal grid or layer in between targets (in the Z direction). However, optical characteristics from previous target structures can interfere with subsequently printed target structures, and there are potential added material costs in the case of a metal grid or additional layer. As devices continue to be manufactured on smaller scales with more layers, it may be necessary to perform overlay measurements more often with an increased number of targets. Accordingly, space-saving techniques are needed in the art.

SUMMARY

In one aspect, this disclosure is directed to an overlay metrology target including "disappearing" or sacrificial layers that leave no optical trace impacting OVL measurement when processed. In an embodiment, an overlay metrology target may include at least one overlay target structure inducing an optical characteristic and at least one secondary overlay target structure inducing a temporary optical characteristic. The at least one secondary overlay target structure being removable by a lithographic process and/or by etch or clean process, where removal of the at least one secondary overlay target structure removes the temporary optical characteristic. That is, the secondary target structure or "layer" leaves no optical trace impacting OVL measurement when removed, thereby allowing another target structure (e.g., a tertiary target structure or layer) to be printed in a region previously occupied by at least a portion of the secondary target structure.

In another aspect, this disclosure is directed to a system and method for performing overlay metrology. In an embodiment, an overlay metrology system may include at least one illumination source configured to illuminate an overlay metrology target for a sample, where the sample (e.g., a wafer) includes a substrate with at least a first layer and a second layer formed thereon. The overlay metrology target may include at least one overlay target structure inducing an optical characteristic and at least one secondary overlay target structure inducing a temporary optical characteristic, where the overlay target structure is associated with the first layer of the sample, and the secondary overlay target structure is associated with the second layer of the sample. The system may further include at least one detector configured to receive illumination reflected, scattered, or radiated from the overlay metrology target, the detected illumination being affected by the optical characteristic of the overlay target structure and the temporary optical characteristic of the secondary overlay target structure. At least one computing system in communication with the detector may be configured to determine a misalignment between the first layer and the second layer of the sample based upon the detected illumination. For example, the computing system may be configured to determine a misalignment between the first layer and the second layer based upon detecting optical signals or image frames indicative of a spatial relationship between the overlay target structure and the secondary overlay target structure.

The secondary target structure may be removed by a lithography process and/or by etch or clean process and replaced with a tertiary target structure associated with a third sample layer (e.g., a physical layer or a lithography layer). Accordingly, the system may perform overlay metrology to determine a misalignment between the first layer and the third layer by imaging or detecting optical signals associated with illumination reflected, scattered, or radiated from the same sample region, but with a different overlay target (i.e. a target formed from the overlay target structure and the tertiary overlay target structure). In some embodiments, the tertiary overlay target structure may be sacrificial as well, thereby allowing additional overlay metrology targets to be formed by replacing the tertiary overlay target structure and any other sacrificial structures or layers in the same manner discussed above with respect to removal and replacement of the secondary overlay target structure.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

FIGS. 1A through 7B generally illustrate overlay metrology targets having one or more sacrificial target structures or "layers" and a system and method of making and/or using the same. The following embodiments are provided for illustrative purposes, and it should be understood that the features and arrangements described below may be modified or combined to produce additional embodiments. For example, those skilled in the art will appreciate that portions of the following embodiments may be modified or combined to achieve an overlay metrology target or an overlay metrology system complying with a set of manufacturing design rules or satisfying a selected level of process compatibility.

Figure 1A:
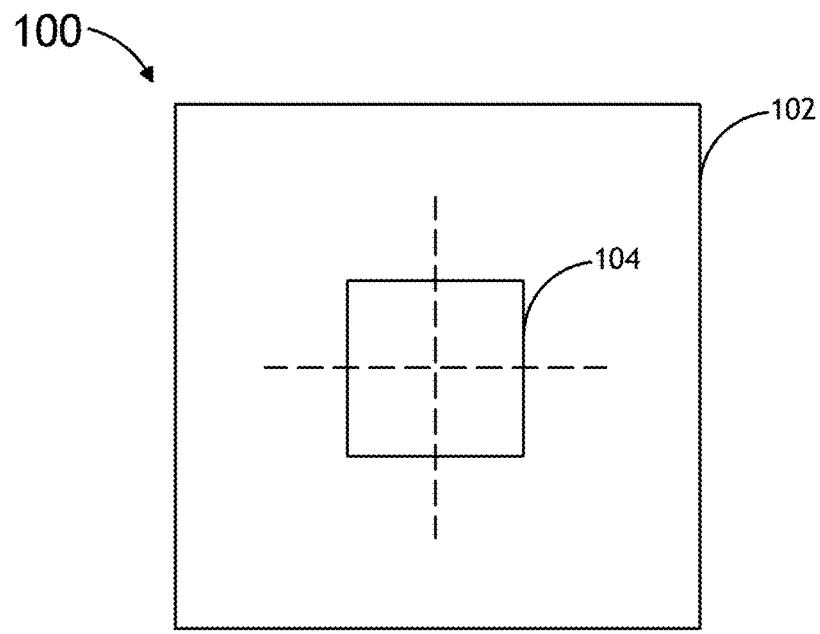
FIG. 1A is a conceptual illustration of a box-in-box (BIB) overlay metrology target, in accordance with an embodiment of this disclosure.
Figure 1B:
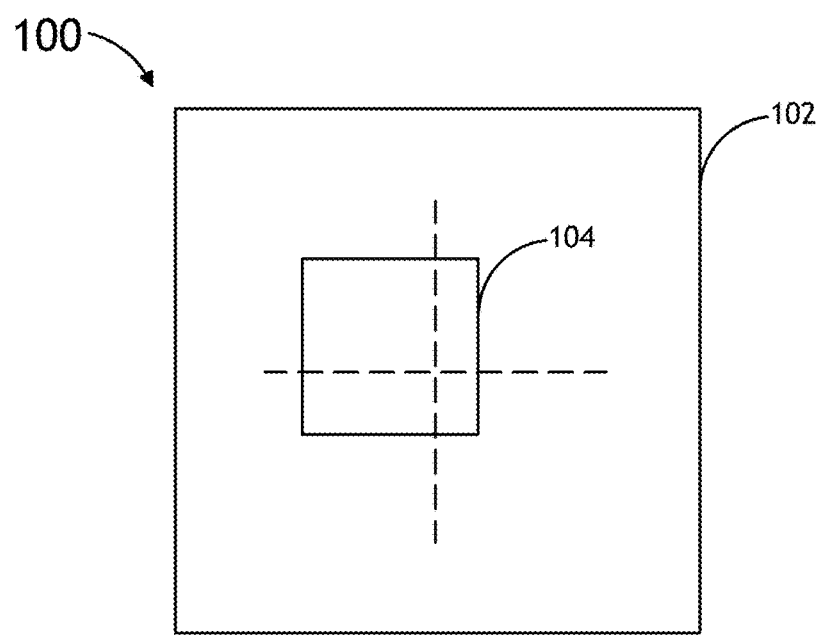
FIG. 1B is a conceptual illustration of a BIB overlay metrology target, in accordance with an embodiment of this disclosure.

FIGS. 1A and 1B illustrate an overlay metrology target 100 in accordance with an embodiment of this disclosure. The overlay target 100 may include a plurality of target structures. In some embodiments, the target structures are manufactured from a separate process layers and successively disposed upon a substrate, such as a silicon wafer. As used throughout the present disclosure, a "wafer" or, more generally, a "sample" may refer to a substrate formed of a semiconductor or non-semiconductor material. For example, a semiconductor or non-semiconductor material may include, but is not limited to, monocrystalline silicon, gallium arsenide, or indium phosphide. A wafer may include one or more layers. For example, such layers may include, but are not limited to, a resist, a dielectric material, a conductive material, or a semiconductive material. Many different types of such layers are known in the art such as, but not limited to, isolation layers, implantation layers, and the like. The terms "wafer" and "sample" as used herein are intended to encompass a substrate on which any of such layers may be formed.

The overlay target 100 may include at least a first target structure 102 and a second target structure 104. In some embodiments, as shown in FIGS. 1A and 1B, the first target structure 102 and the second target structure 104 may form a box-in-box (BIB) or frame-in-frame (FIF) overlay metrology target 100. Where the first target structure 102 is associated with a first layer of a sample and the second target structure 104 is associated with a second layer disposed upon the sample, overlay error between the first layer and the second layer may be determined by detecting and/or analyzing a spatial relationship between the first target structure 102 an the second target structure 104. For example, as shown in FIG. 1B, the first target structure 102 and the second target structure 104 may be misaligned (i.e., the center of a frame/box formed by the first target structure 102 is not aligned with the center of a frame/box formed by the second target structure 104). Accordingly, X and Y offsets may be determined between the first target structure 102 and the second target structure 104, and the determined offsets may correspond to a misalignment between the corresponding sample layers.

Figure 2A:
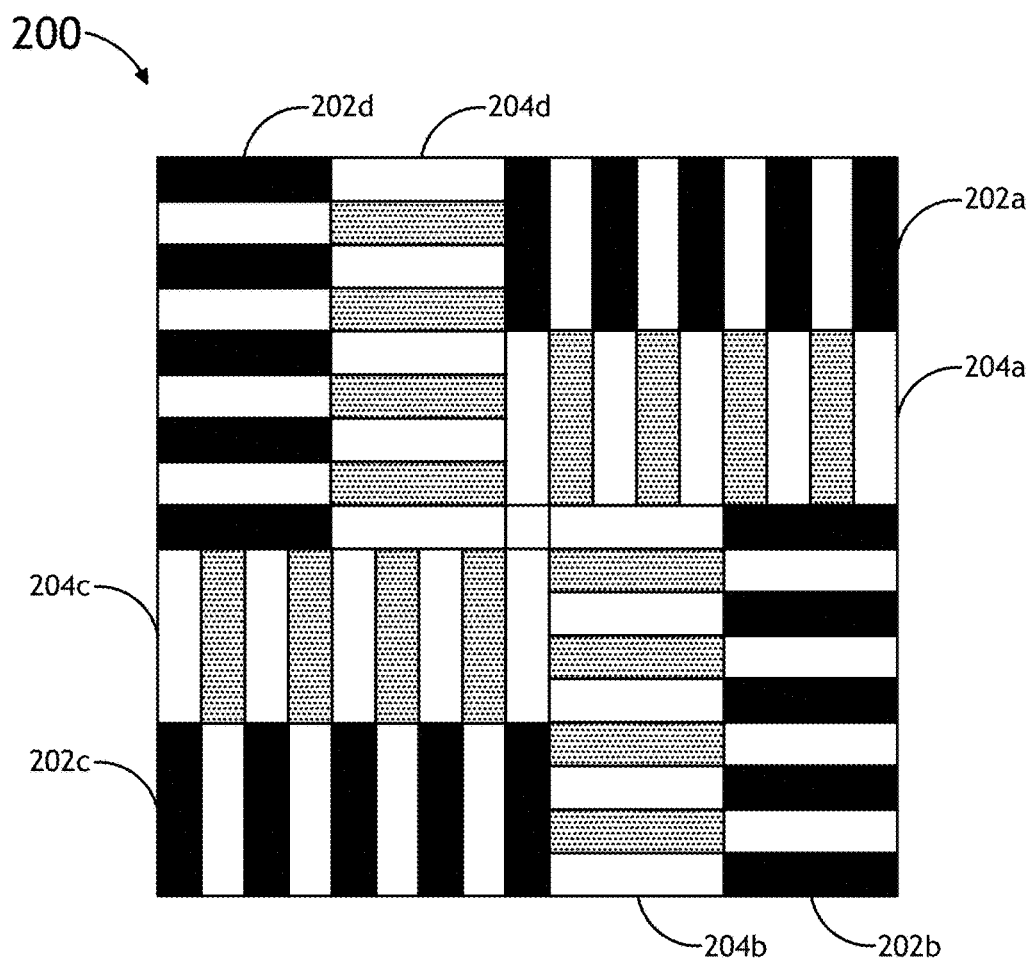
FIG. 2A is a conceptual illustration of an advanced imaging metrology (AIM) overlay metrology target, in accordance with an embodiment of this disclosure.
Figure 2B:
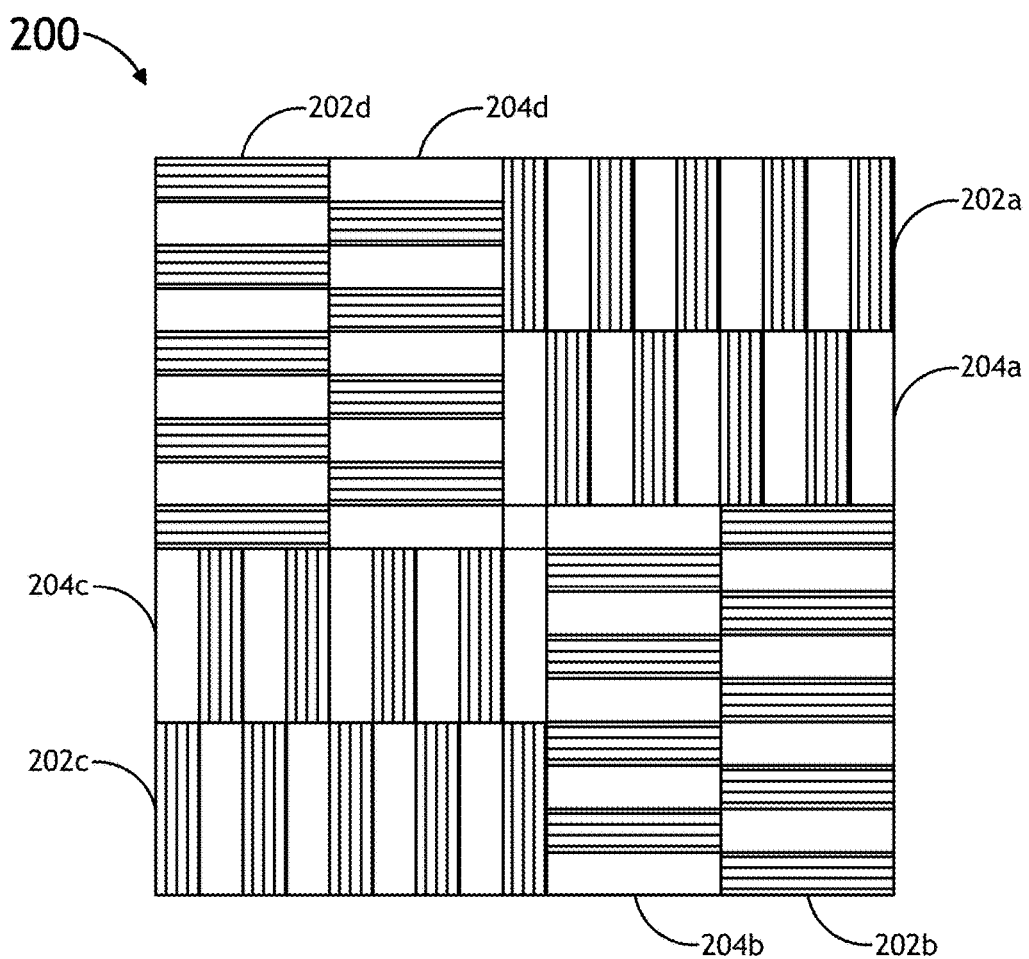
FIG. 2B is a conceptual illustration of an AIM overlay metrology target including segmented pattern elements, in accordance with an embodiment of this disclosure.

Looking now to FIG. 2A, an overlay metrology target 200 is illustrated, where the overlay target 200 includes at least one target structure 202 formed from a first plurality of pattern elements 202a-202d and at least one secondary target structure 204 is formed from a second plurality of pattern elements 204a-204d. The first target structure 202 and the second target structure 204 may form an advanced imaging metrology (AIM) overlay metrology target 200. Similar to the BIB metrology target 100, the first target structure 202 or one or more of the pattern elements 202a-202d forming the first target structure 202 may be spatially compared with the second target structure 204 or one or more of the pattern elements 204a-204d forming the second target structure 204 to determine a misalignment between the target structures 202 and 204 or portions thereof. The determined misalignment (e.g., X and Y offsets) may be indicative of a misalignment between corresponding layers of the sample. The pattern elements may include periodic features which are known a priori, and thus, nuisance signals that do not exhibit periodicity can be filtered out for enhanced accuracy. In some embodiments, as shown in FIG. 2B, the pattern elements 202a-202d and 204a-204d may be segmented (e.g., according to feature size/spacing) for process compatibility.

Figure 3A:
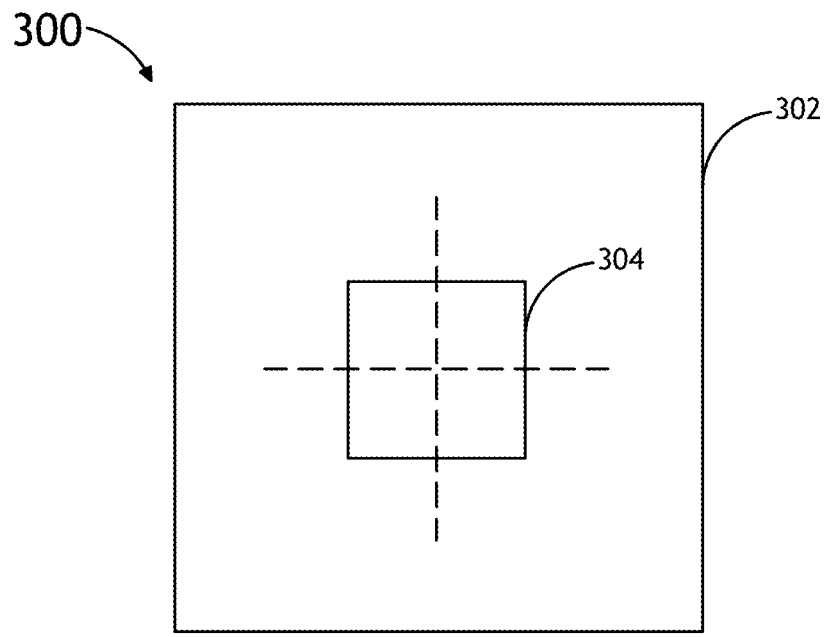
FIG. 3A is a conceptual illustration of a BIB overlay metrology target including at least one overlay target structure inducing an optical characteristic and at least one secondary overlay target structure inducing a temporary optical characteristic, in accordance with an embodiment of this disclosure.
Figure 3B:
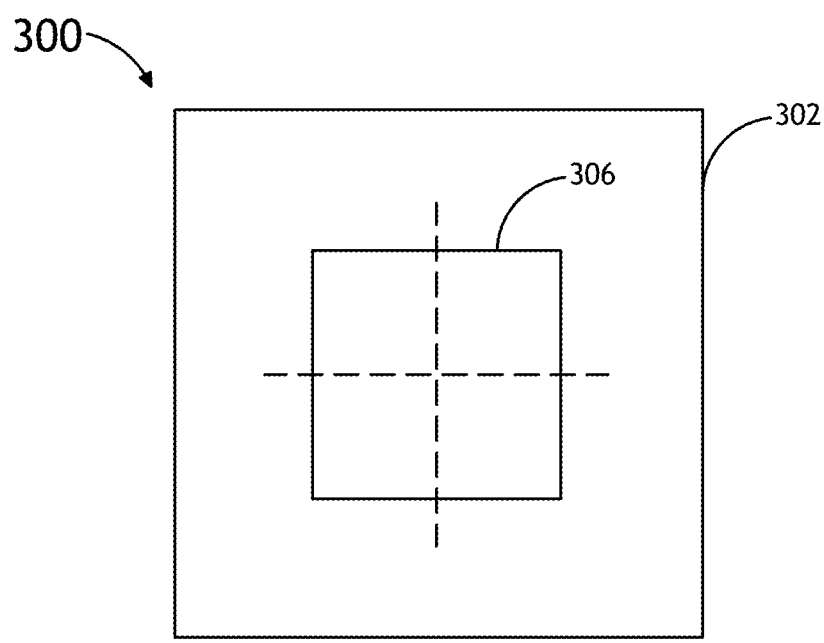
FIG. 3B is a conceptual illustration of a BIB overlay metrology target including at least one overlay target structure inducing an optical characteristic and at least one tertiary overlay target structure formed after removal of a secondary overlay target structure, in accordance with an embodiment of this disclosure.

At least one of the target structures 202, 204 may be formed from a layer including one or more features that are removable upon processing (e.g., lithographic processing, cleaning, or etching). The removable or sacrificial target structure/layer may be configured to induce a temporary optical characteristic that is substantially removed upon removal of the associated target structure. For example, as shown in FIGS. 3A and 3B, an overlay target 300 may include at least a first target structure 302 configured to induce an optical characteristic, such as an isolation layer, and at least a secondary target structure 304 configured to induce a temporary optical characteristic, such as an implant layer. The optical characteristic induced by the first target structure 302 may persist (i.e., may at least partially affect an optical signal collected from the target 300) after a lithography process has been performed on the target region, while the secondary target structure 304 may be substantially removed without any remaining optical trace impacting OVL measurement. Accordingly, a new target may be formed by disposing at least one tertiary target structure 306 in place of the secondary target structure 304 or in a region including at least a portion of the region previously occupied by the secondary target structure 304.

As shown in FIG. 3B, the tertiary target structure 306 and any other successive target structures may be differently dimensioned than the secondary target structure 304. Further, successive target structures may be sacrificial as well to allow for reuse of the target space or may be configured to induce an optical characteristic (like the first target structure 302). In some embodiments, for example, the first target structure 302 is associated with a first layer formed on a substrate and the second target structure 304 is associated with a second layer formed on the substrate. After performing overlay metrology to determine any misalignment between the first layer and the second layer, the second target structure 304 may be replaced with the tertiary target structure 306, which may be associated with a third layer formed on the substrate. Accordingly, overlay metrology can be performed with the same target space, but using a different target (i.e., including the first target structure 302 and the tertiary target structure 306) to determine any misalignment between the first layer and the third layer. In addition to saving device space dedicated to metrology targets, being able to reuse the same space reduces errors associated with surface variations of the substrate and/or printing variations when reproducing similar target structures at different locations of the substrate. Since at least one target structure is reused, alignment accuracy can be improved between metrology marks and the associated measurements.

Figure 4A:
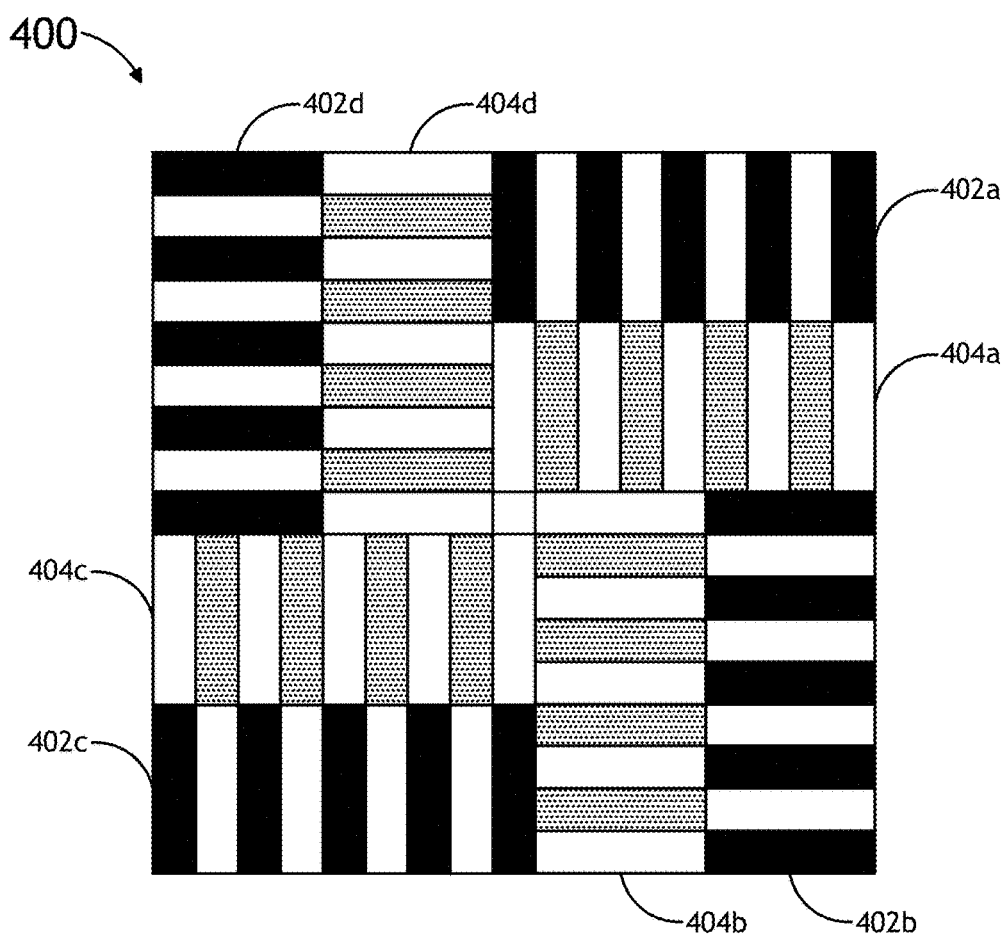
FIG. 4A is a conceptual illustration of an AIM overlay metrology target including at least one overlay target structure inducing an optical characteristic and at least one secondary overlay target structure inducing a temporary optical characteristic, in accordance with an embodiment of this disclosure.
Figure 4B:
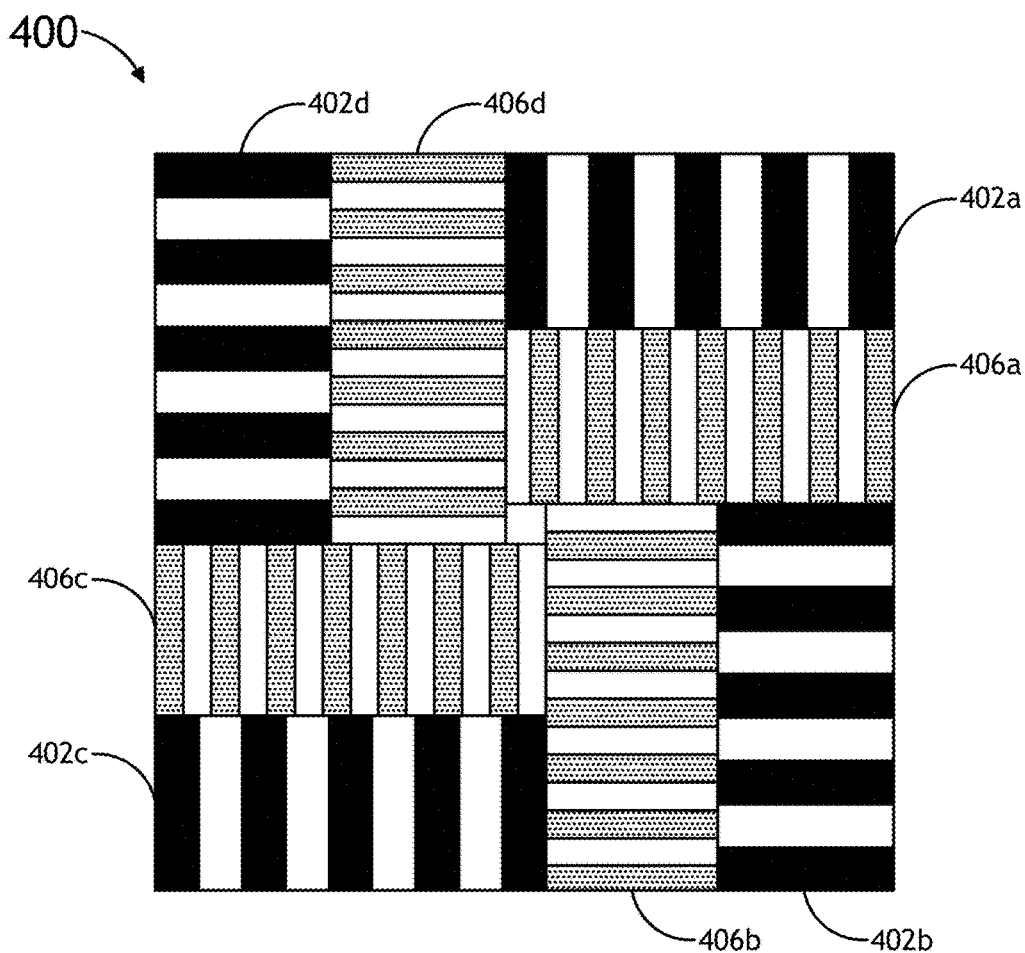
FIG. 4B is a conceptual illustration of an AIM overlay metrology target including at least one overlay target structure inducing an optical characteristic and at least one tertiary overlay target structure formed after removal of a secondary overlay target structure, in accordance with an embodiment of this disclosure.

FIGS. 4A and 4B illustrate another embodiment where an overlay metrology target 400 (e.g., an AIM overlay target) includes at least a first target structure 402 formed from a plurality of pattern elements 402a-402d and at least a second target structure 404 formed from a second plurality of pattern elements 404a-404d. As with the embodiments of overlay target 300 discussed above, the first plurality of pattern elements 402a-402d forming the first target structure 402 (e.g., an isolation layer) may be configured to induce an optical characteristic, and the second plurality of pattern elements 404a-404d forming the second target structure 404 (e.g., an implant layer) may be configured to induce a temporary optical characteristic. Upon removal of the second target structure 404 (e.g., by lithography, cleaning or etching), a third target structure 406 may be formed in place of the second target structure 404 from a third plurality of pattern elements 406a-406d. As shown in FIG. 4B, the third target structure 406 may be differently dimensioned or may be formed from differently pattern elements 406a-406d. Those skilled in the art will appreciate that the foregoing embodiments are exemplary and that the number or type of sacrificial and non-sacrificial layers may be varied without departing from the scope of the present disclosure. In some embodiments, for example, an overlay metrology target 400 may include more than two target structures/layers which may correspond to two or more layers of sample.

Figure 5A:
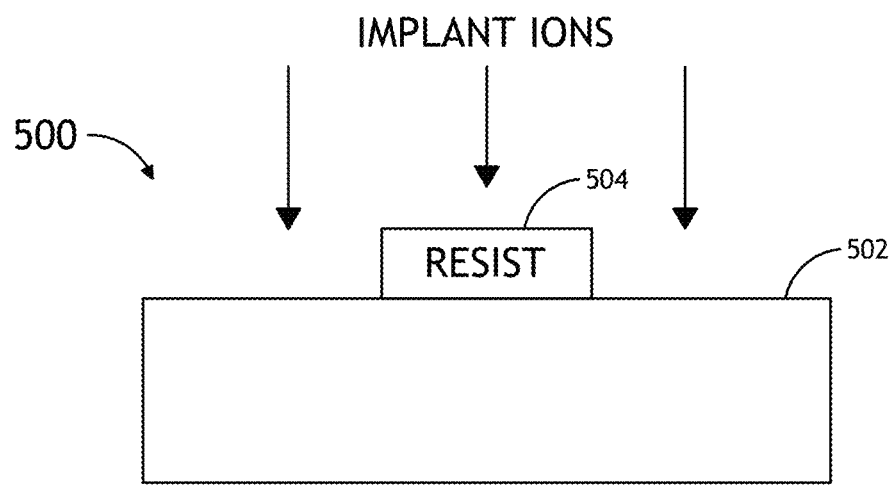
FIG. 5A is a conceptual illustration of a resist formed on a substrate, where an ion implantation process is performed upon a region of the substrate including the resist, in accordance with an embodiment of this disclosure.
Figure 5B:
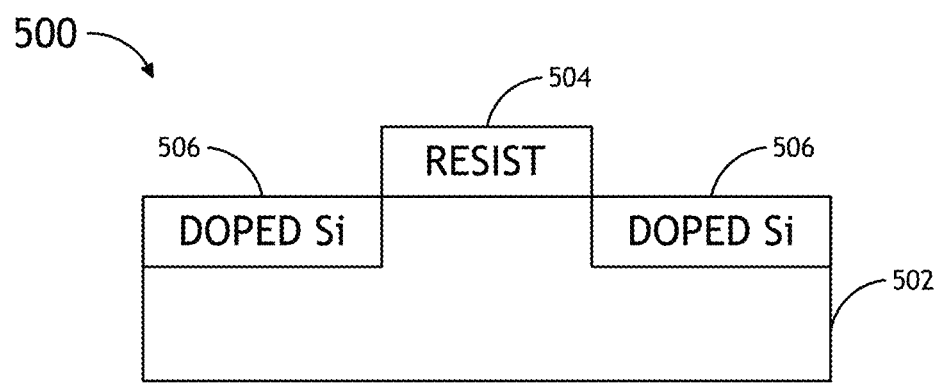
FIG. 5B is a conceptual illustration of an implant layer formed on a substrate after an ion implantation process is performed upon a region of the substrate including a resist, in accordance with an embodiment of this disclosure.
Figure 5C:
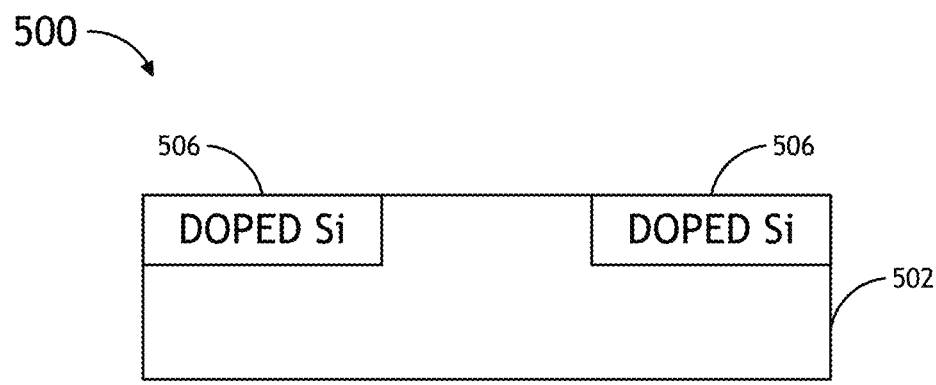
FIG. 5C is a conceptual illustration of substrate region after a lithography process is performed on an implant layer, where a resist is removed due to the lithography process and/or by etch or clean process, in accordance with an embodiment of this disclosure.

As discussed above, sacrificial layers that are substantially undetectable (i.e., leave no optical trace impacting OVL measurement) after processing are known in the art. In some embodiments, for example, a sacrificial layer may include an implant layer. As shown in FIGS. 5A through 5C, a target structure 500 may include a resist 504 disposed upon a substrate 502, where the resist 504 protects the substrate 502 from processing effects. Ions may be implanted in a region of the substrate 502 including the resist 504 to form the ion-implanted layer (e.g., doped silicon 506 shown in FIG. 5B). In some embodiments, for example, the ions may be implanted via an ion-beam or by any other ion implantation process known in the art. When the resist 504 is removed (e.g., via lithographic processing, cleaning, or etching), as shown in FIG. 5C, the optical characteristics (e.g., surface structure or reflectivity) of the substrate 502 are returned to pre-implant conditions, although the electrical properties may be changed (e.g., due to doping). Accordingly, a new target structure/layer can be formed in place of the implant layer to generate new overlay target.

Various modifications are contemplated in patterning, segmentation, spacing, pitch, number, and type of sacrificial/non-sacrificial layers, and other attributes of a metrology target. Several types of metrology targets may be formed such as, but not limited to, BIB, AIM, advanced imaging metrology in die (AIMid), Blossom or SCOL targets. The embodiments, described above are illustrative of various features but are not intended to restrict the present disclosure in any way.

Figure 6:
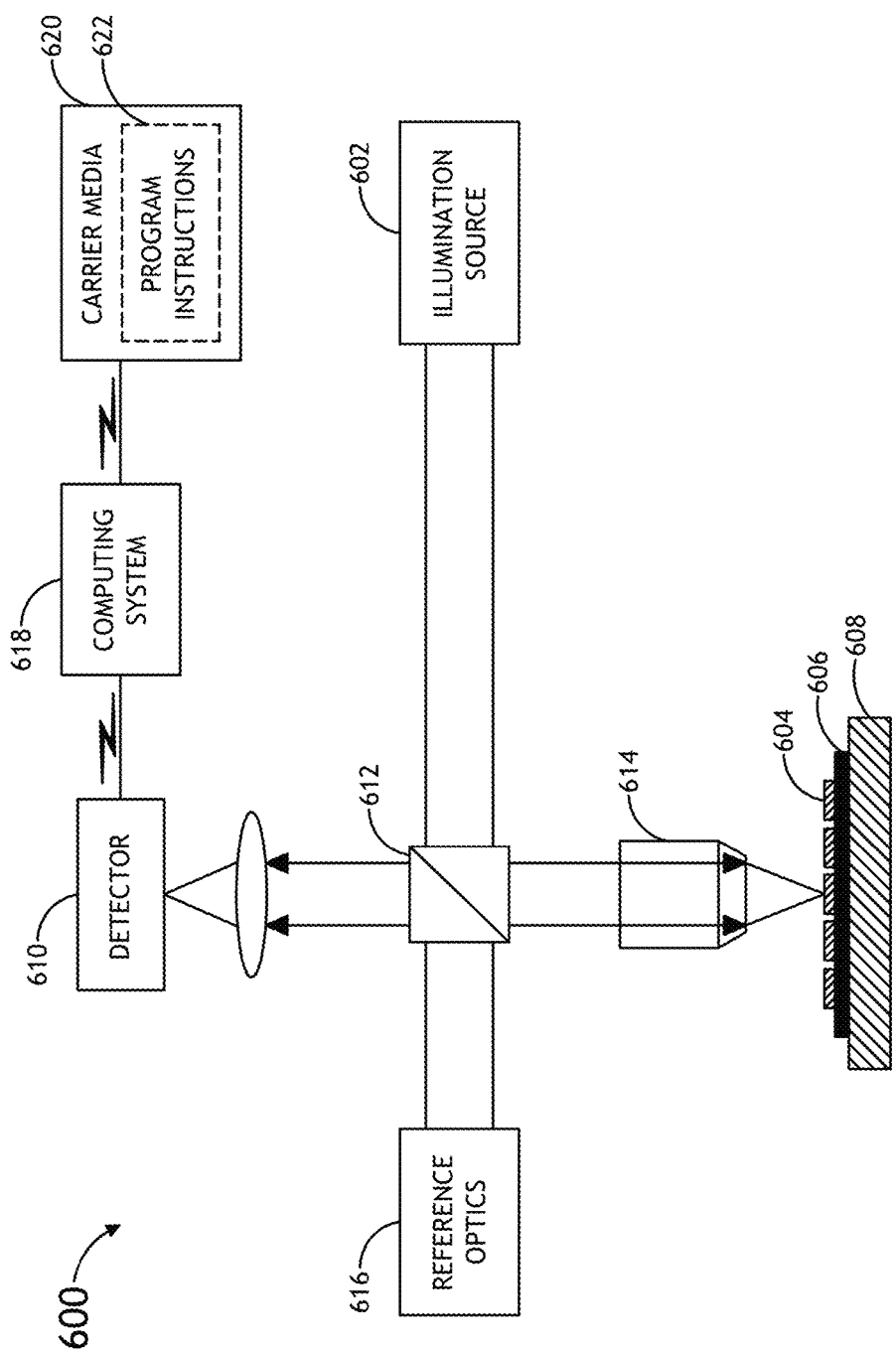
FIG. 6 is a block diagram illustrating an overlay metrology system, in accordance with an embodiment of this disclosure.

FIG. 6 is a block diagram illustrating an overlay metrology system 600 in accordance with an embodiment of this disclosure. The overlay metrology system 600 may include an optical metrology system, such as the systems described or referenced in U.S. patent application Ser. No. 13/186,144. The system 600 may include at least one illumination source 602 configured to illuminate an overlay metrology target 604 disposed upon a substrate 606, where the overlay target 604 includes a target in accordance with the foregoing embodiments. The substrate 606 may be supported by a sample stage 608, which may include at least one linear or rotating actuator for translating or rotating the substrate 606 to a selected position.

The system 600 may include at least one beam splitter 612 configured to direct illumination emanating from the illumination source 602 along at least a first (object) path to the overlay target 604 and second (reference) path delineated by reference optics 616, such as a reference mirror. Illumination reflected, scattered, or radiated from the surface of the substrate 606 including the overlay target 604 may be collected via an objective lens 614 and directed along a collection path to at least one detector 610. At least one computing system 618 in communication with the detector 610 may be configured to collect imaging data associated with the illumination received from the surface of the substrate 606. The computing system 618 may be configured to determine an overlay error or spatial misalignment between at least two layers formed on the substrate 606 utilizing information (e.g., image frames or contrast data) associated with the imaging data collected for the overlay target 604.

It should be recognized that the various steps and functions described throughout the present disclosure may be carried out by a single computing system or by multiple computing systems. For example, the computing system 618 may include, but is not limited to, a personal computing system, mainframe computing system, workstation, image computer, parallel processor, or any other device known in the art. In general, the computing system 618 may include at least one single-core or multiple-core processor configured to execute program instructions 622 from at least one carrier medium 620. In an embodiment, the program instructions 622 may include one or more instruction sets configured to cause a processor of the computing system 618 to perform one or more steps of the method 700 described below.

Figure 7A:
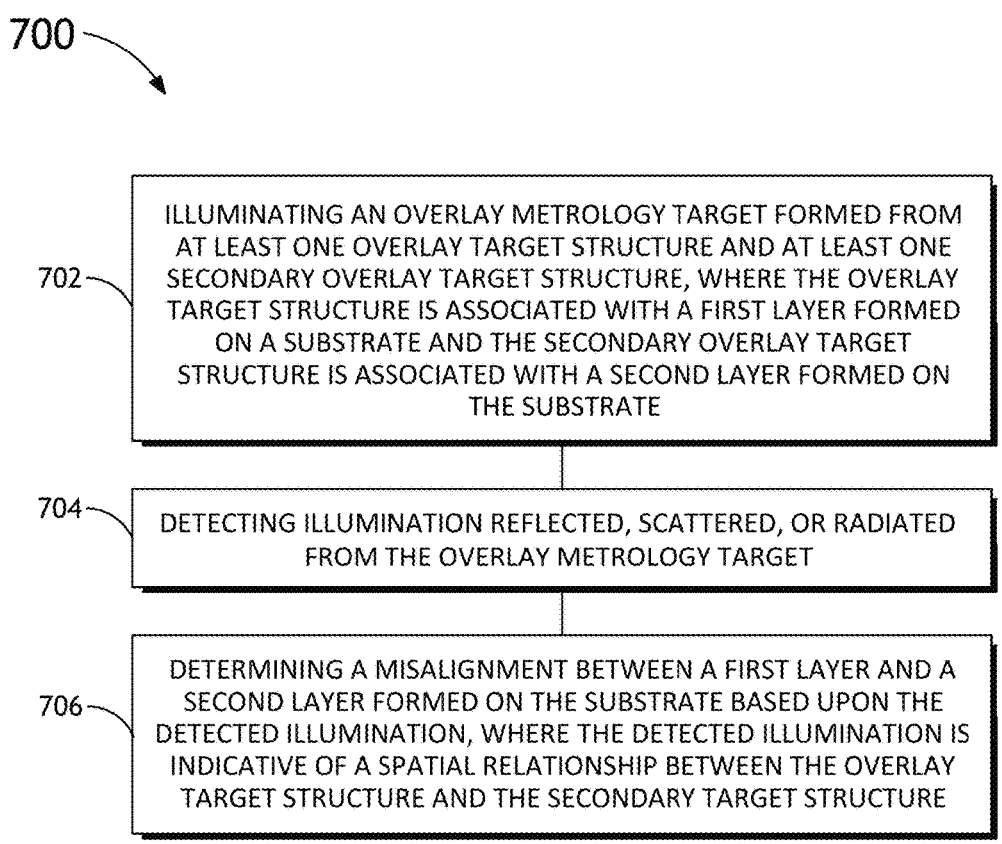
FIG. 7A is a flow diagram illustrating a method of performing overlay metrology with reusable target space, in accordance with an embodiment of this disclosure.

FIG. 7A is a flow diagram illustrating a method 700 of performing overlay metrology with a "partly disappearing" metrology target (i.e., an overlay target including one or more sacrificial target structures/layers as described above). At step 702, an overlay metrology target 604 disposed upon a substrate 606 is illuminated, where the overlay metrology target includes at least a first target structure configured to induce an optical characteristic and a secondary target structure configured to induce a temporary optical characteristic. In some embodiments, the first target structure or target layer may be associated with a first device layer disposed upon the substrate 606, and the second target structure or layer may be associated with a second device layer disposed upon the substrate 606. At step 704, illumination reflected, scattered, or radiated by the target is collected via collection optics, such as the objective lens 614 and directed to at least one imaging detector 610, such as a TDI camera. The detected illumination may be affected (i.e., may include optical signals) associated with the first and second target structures. At step 706, the imaging data is processed to determine a misalignment between at least two layers disposed upon the substrate 606. It is noted herein that the imaging data may be processed according to any overlay metrology algorithm known in the art. For example, a spatial comparison between pattern elements or features forming the target structures to determine a relative displacement (i.e. overlay error) between at least two sample layers, such as the first layer associated with the first target structure and the second layer associated with the second target structure.

Figure 7B:
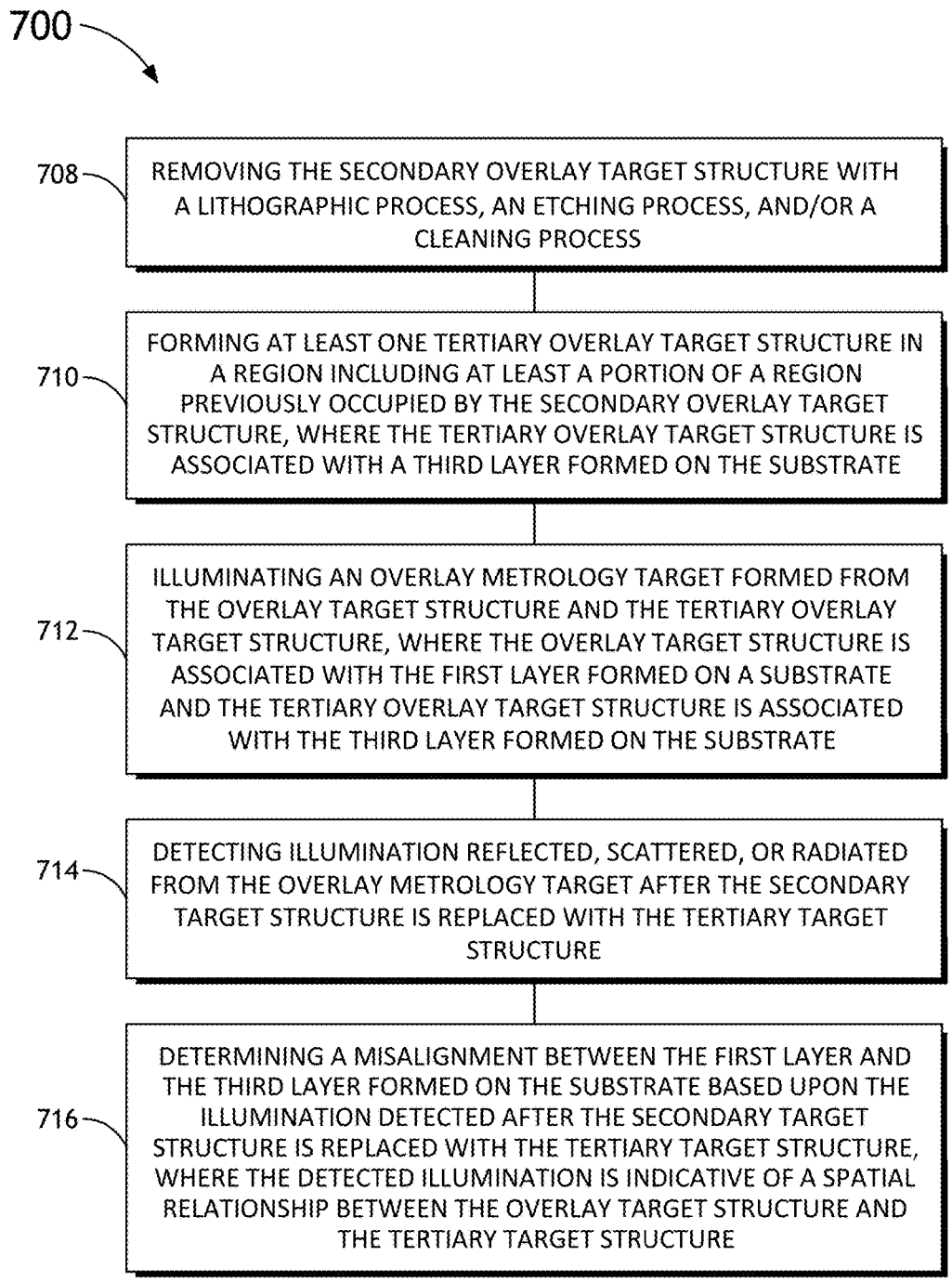
FIG. 7B is a flow diagram illustrating a method of performing overlay metrology with reusable target space, in accordance with an embodiment of this disclosure.

As shown in FIG. 7B, the method 700 may include additional steps for performing additional overlay measurements with subsequently formed overlay targets in the same (or at least partially overlapping) target space. At step 708, the second target structure (i.e., the sacrificial structure/layer) may be removed via a lithographic, etching, and/or cleaning process. At step 710, another target structure (e.g., a tertiary target structure) may be formed at least partially in place of the second target structure, where the subsequently formed (third) target structure is associated with a third device layer (e.g., physical or lithography layer) formed on the substrate. At step 712, the newly formed overlay target including the first target structure and the third target structure is illuminated, and at step 714, illumination reflected, scattered, or radiated from the overlay target is detected (e.g., in a manner as described above in step 704). At step 716, the imaging data associated with the subsequently formed target is processed to determine a misalignment between at least two layers disposed upon the substrate, such as the first layer associated with the first target structure and the third layer associated with the third target structure. When the third target structure is formed from sacrificial features, steps 708 through 716 may be repeated, where the third target structure is replaced, for example, with a fourth target structure, and so on, until the target space is used to form an overlay target including only non-sacrificial layers. Accordingly, the method 700 reduces the amount of space on the substrate needed for overlay metrology targets, and enhances overlay measurement accuracy by aligning with the same region on the substrate and reusing at least one target structure for multiple targets successively formed in the target space.

Those having skill in the art will appreciate that there are various vehicles by which processes and/or systems and/or other technologies described herein can be carried out (e.g., hardware, software, and/or firmware), and that the preferred vehicle will vary with the context in which the processes and/or systems and/or other technologies are deployed.

In some embodiments, various steps, functions, and/or operations are carried out by one or more of the following: electronic circuits, logic gates, multiplexers, programmable logic devices, ASICs, analog or digital controls/switches, microcontrollers, or computing systems. A computing system may include, but is not limited to, a personal computing system, mainframe computing system, workstation, image computer, parallel processor, or any other device known in the art. In general, the term "computing system" is broadly defined to encompass any device having one or more processors, which execute instructions from a carrier medium. Program instructions implementing methods such as those described herein may be transmitted over or stored on carrier media. A carrier medium may include a transmission medium such as a wire, cable, or wireless transmission link. The carrier medium may also include a storage medium such as a read-only memory, a random access memory, a magnetic or optical disk, or a magnetic tape.

All of the methods described herein may include storing results of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

Although particular embodiments of this invention have been illustrated, it is apparent that various modifications and embodiments of the invention may be made by those skilled in the art without departing from the scope and spirit of the foregoing disclosure. Accordingly, the scope of the invention should be limited only by the claims appended hereto.

What is claimed is:

1. An overlay metrology target, comprising:
   a first overlay target structure;

a tertiary overlay target structure, the first overlay target structure and the tertiary overlay target structure formed on a sample, the sample including a substrate with at least a first layer, a second layer, and at least a third layer formed thereon, the first overlay target structure being associated with the first layer of the sample, wherein the first overlay target structure is formed on an area dedicated for a target structure; and the tertiary overlay target structure associated with the third layer of the sample, wherein the third layer of the sample is formed on the second layer of the sample, wherein the tertiary overlay target structure is formed in an area at least partially overlapping with an area previously occupied by a removable secondary overlay target structure, wherein the removable secondary overlay target structure is associated with the second layer of the sample, wherein the tertiary overlay target structure forms an optical characteristic different from a temporary optical characteristic of the removable secondary overlay target structure.

2. The overlay metrology target of claim 1, wherein the tertiary overlay target structure includes one or more features having a dimension, periodicity, or orientation different from the removable secondary overlay target structure.

3. The overlay metrology target of claim 1, wherein the optical characteristic of the tertiary overlay target structure includes at least one of a surface structure or reflectivity.

4. The overlay metrology target of claim 1, wherein the tertiary overlay target structure is removable by at least one of a lithographic process, an etching process, or a cleaning process, and wherein removal of the tertiary overlay target structure removes the temporary optical characteristic of the tertiary overlay target structure.

5. The overlay metrology target of claim 1, wherein at least one of the secondary overlay target structure or the tertiary overlay target structure comprises an implant layer, the implant layer including at least one resist with an ion-implantation process performed thereon, the at least one resist being removable by at least one of a lithographic process, an etching process, or a cleaning process.

6. The overlay metrology target of claim 1, wherein at least one of the first overlay target structure, the secondary target structure, or the tertiary target structure are formed from at least one of segmented or un-segmented pattern elements.

7. The overlay metrology target of claim 1, wherein the first overlay target structure and at least one of the secondary overlay target structure or the tertiary overlay target structure form a box-in-box (BIB), frame-in-frame (FIF), Blossom, advanced imaging metrology in die (AIMid) or advanced imaging metrology (AIM) target.

8. The overlay metrology target of claim 1, wherein the first overlay target structure and at least one of the secondary overlay target structure or the tertiary overlay target structure form a scatterometry overlay (SCOL) target.

9. A system for performing overlay metrology, comprising:

at least one illumination source configured to illuminate an overlay metrology target of a sample, the sample including a substrate with at least a first layer, a second layer, and at least a third layer formed thereon, the overlay metrology target including:

a first overlay target structure, the first overlay target structure being associated with the first layer of the sample, wherein the first overlay target structure is formed on an area dedicated for a target structure; and a tertiary overlay target structure associated with the third layer of the sample, wherein the third layer is formed on the second layer of the sample, wherein the tertiary overlay target structure is formed in an area at least partially overlapping with an area previously occupied by a removable secondary overlay target structure, wherein the removable second overlay target structure is associated with the second layer of the sample, wherein the tertiary overlay target structure forms an optical characteristic different from a temporary optical characteristic of the removable secondary overlay target structure;

at least one detector configured to receive illumination reflected, scattered, or radiated from one or more portions of the overlay metrology target; and at least one computing system in communication with the at least one detector, the at least one computing system being configured to determine a misalignment between the first overlay target structure and the tertiary overlay target structure of the sample based upon the received illumination.

10. The system of claim 9, wherein the tertiary overlay target structure includes one or more features having a dimension, periodicity, or orientation different from the removable secondary overlay target structure.

11. The system of claim 10, wherein the tertiary overlay target structure forms a temporary optical characteristic, wherein the temporary optical characteristic includes at least one of a surface structure or reflectivity, wherein the tertiary overlay target structure is removable by at least one of a lithographic process, an etching process, or a cleaning process, and wherein removal of the tertiary overlay target structure removes the temporary optical characteristic of the tertiary overlay target structure.

12. The system of claim 9, wherein at least one of the at least one removable secondary overlay target structure or the tertiary overlay target structure comprises an implant layer, the implant layer including at least one resist with an ion-implantation process performed thereon, the at least one resist being removable by at least one of a lithographic process, an etching process, or a cleaning process.

13. A method comprising:

forming at least one overlay target structure of an overlay metrology target, the at least one overlay target structure inducing an optical characteristic, the at least one overlay target structure being associated with a first layer formed on a substrate, wherein the first overlay target structure is formed on an area dedicated for a target structure;

a removable secondary overlay target structure associated with a second layer formed on the substrate, wherein the removable secondary overlay target structure is formed in an area at least partially overlapping an area of the first overlay target structure;

forming at least one removable secondary overlay target structure of the overlay metrology target, the at least one removable secondary overlay target structure forming a temporary optical characteristic, the at least one removable secondary overlay target structure being associated with the second layer formed on the substrate;

removing the at least one removable secondary overlay target structure of the overlay metrology target by at least one of a lithographic process, an etching process, or a cleaning process; and forming a third layer on the substrate, wherein the third layer is disposed on the second layer formed on the substrate, and forming at least one tertiary overlay target structure in an area at least partially overlapping with the area previously occupied by the at least one removable secondary overlay target structure, the at least one tertiary overlay target structure forming an optical characteristic different from the temporary optical characteristic of the at least one removable secondary overlay target structure, the at least one tertiary overlay target structure being associated with the third layer formed on the substrate.

14. The method of claim 13, further comprising:
determining a misalignment between the first layer and at least one of the second layer or the third layer.

15. The method of claim 13, wherein the at least one tertiary overlay target structure is removable, wherein the at least one tertiary overlay target structure is removable by at least one of a lithographic process, an etching process, or a cleaning process, and wherein removal of the at least one tertiary overlay target structure removes the temporary optical characteristic of the at least one tertiary overlay target structure.

16. The method of claim 13, wherein at least one of the forming the at least one removable secondary overlay target structure or forming the at least one tertiary overlay target structure comprises:
forming at least one resist on the substrate; and
performing an ion-implantation process on the at least one resist, wherein the at least one resist is removable by at least one of a lithographic process, an etching process, or a cleaning process.

* * * * *